(12) United States Patent
Remington et al.

(10) Patent No.: US 9,691,451 B1
(45) Date of Patent: Jun. 27, 2017

(54) WRITE ASSIST CIRCUIT AND METHOD THEREFOR

(71) Applicant: NXP USA, Inc., Austin, TX (US)

(72) Inventors: Scott Ives Remington, Austin, TX (US); Alexander Hoefler, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/356,872

(22) Filed: Nov. 21, 2016

(51) Int. Cl.
G11C 7/22 (2006.01)
G11C 7/12 (2006.01)
G11C 7/10 (2006.01)

(52) U.S. Cl.
CPC .............. G11C 7/12 (2013.01); G11C 7/1012 (2013.01)

(58) Field of Classification Search
CPC .................................. G11C 7/22; G11C 7/10
USPC ........................................ 365/189.02, 189.05
See application file for complete search history.

(56) References Cited

U.S. PATENT DOCUMENTS

| | | | | |
|---|---|---|---|---|
| 5,257,232 A * | 10/1993 | Dhong | ............... | G11C 11/4091 365/203 |
| 6,084,800 A * | 7/2000 | Choi | ..................... | G11C 16/30 327/536 |
| 6,256,250 B1 * | 7/2001 | Miki | ..................... | G11C 5/145 327/536 |
| 7,324,368 B2 | 1/2008 | Wang et al. | | |
| 7,800,959 B2 | 9/2010 | Childs et al. | | |
| 8,120,975 B2 | 2/2012 | Kenkare et al. | | |
| 9,070,432 B2 | 6/2015 | Hsieh et al. | | |
| 9,177,624 B1 * | 11/2015 | Wu | ........................ | G11C 8/08 |
| 9,311,980 B1 * | 4/2016 | Gogl | ................... | G11C 11/1693 |
| 2011/0102070 A1 * | 5/2011 | Chen | ................ | H03K 17/08122 327/536 |
| 2011/0316500 A1 * | 12/2011 | Tang | ................... | H02M 3/1588 323/268 |
| 2012/0320699 A1 * | 12/2012 | Noguchi | ................. | G11C 8/08 365/226 |
| 2013/0051138 A1 * | 2/2013 | Kwon | ................ | G11C 13/0004 365/163 |
| 2013/0120321 A1 * | 5/2013 | Nemoto | ................ | G06F 3/0412 345/175 |
| 2013/0162337 A1 * | 6/2013 | Chien | ....................... | G05F 3/02 327/536 |
| 2013/0257521 A1 * | 10/2013 | Syed | ....................... | H02M 3/07 327/536 |
| 2013/0320953 A1 * | 12/2013 | Cassel | ................... | H02M 3/155 323/311 |
| 2015/0077174 A1 * | 3/2015 | Chuang | ................... | H02M 3/07 327/536 |
| 2016/0072382 A1 * | 3/2016 | Ranmuthu | .............. | H02M 3/07 363/60 |
| 2016/0149578 A1 * | 5/2016 | Lee | ................ | H03K 19/018528 327/108 |

(Continued)

*Primary Examiner* — Michael Tran

(57) ABSTRACT

A circuit includes a first driver to provide a first driver signal at an output. The first driver signal corresponds to a voltage operatively coupled to a VSS terminal of the first driver when driving a logic low. A first capacitor includes a first terminal coupled to the VSS terminal of the first driver. A boost circuit includes a first input coupled to the output of the first driver and a first output coupled to a second terminal of the first capacitor. The boost circuit is configured to cause the first capacitor to provide a boosted voltage at the VSS terminal.

20 Claims, 3 Drawing Sheets

(56) References Cited

U.S. PATENT DOCUMENTS

| | | | |
|---|---|---|---|
| 2016/0159088 A1* | 6/2016 | Sano | B41J 2/04541 347/68 |
| 2016/0167367 A1* | 6/2016 | Takagi | B41J 2/04551 347/10 |
| 2016/0190919 A1* | 6/2016 | Queck | H02M 3/07 363/60 |
| 2016/0211739 A1* | 7/2016 | Hissink | H03F 1/523 |
| 2016/0260409 A1* | 9/2016 | Lin | G09G 5/006 |
| 2016/0275887 A1* | 9/2016 | Xiao | G09G 3/3648 |
| 2016/0352329 A1* | 12/2016 | Southern | A61N 2/02 |
| 2016/0381455 A1* | 12/2016 | Zeleznik | H04R 19/04 381/113 |

* cited by examiner

WRITE ASSIST CIRCUIT AND METHOD THEREFOR

BACKGROUND

Field

This disclosure relates generally to memories, and more specifically, to a memory write assist circuit and method therefor.

Related Art

As semiconductor process technology advances, integrated circuit feature sizes (e.g., transistor gate length) continue to decrease. With smaller feature sizes, integrated circuits can be higher performing and operate at lower voltages. These higher performing integrated circuits generally include one or more memories which store and retrieve information at higher frequencies and with smaller voltage swings. However, stability of memory cells continues to be increasingly important as memory cells must be stable against transients, process variations, soft error, and power supply fluctuations which may cause the cell to inadvertently change logic states. With improved stability, write operations to the memory cells can be more challenging.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a write driver circuit and method for operating low voltage memories. The write driver circuit includes write assist features which enable reliable low voltage writes to memory cells. The write assist features include boost circuitry to boost a corresponding write bit line below ground during a write operation. The write driver circuit also includes recycling features. A recycle circuit coupled to the write bit line allows for a boosted write bit line to be pulled up above ground, retriggering the boost circuitry to boost the corresponding write bit line below ground again without changing data input to the write driver. The recycling features allow for repetitive write stress of memory cells and can be useful in test scenarios, for example.

Figure 1:
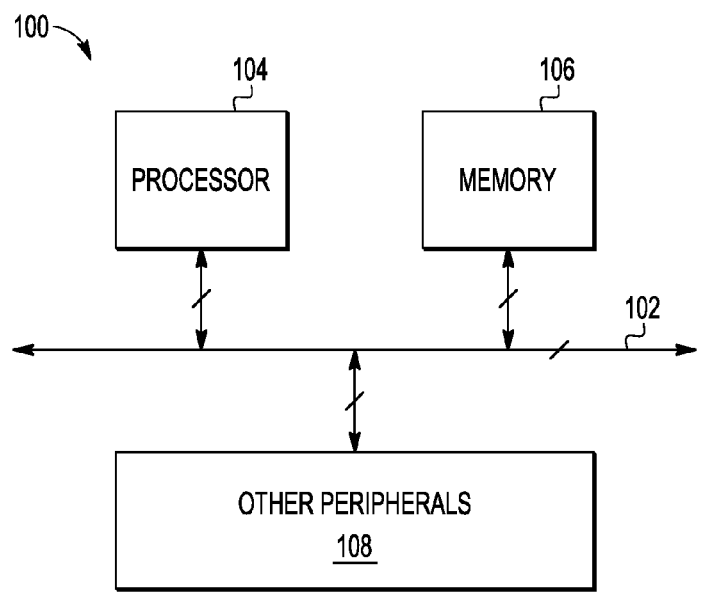
FIG. 1 illustrates, in simplified block diagram form, an integrated circuit in accordance with an embodiment of the present disclosure.

FIG. 1 illustrates, in simplified block diagram form, integrated circuit 100 in accordance with an embodiment of the present disclosure. In some embodiments, integrated circuit 100 may be characterized as a system-on-a-chip (SoC). Integrated circuit 100 includes a system bus 102, processor 104, memory 106, and other peripherals 108. Processor 104, memory 106, and other peripherals 108 are each bi-directionally coupled to system bus 102 by way of respective communication buses. In some embodiments, memory 106 may be formed on a die separate from a die including integrated circuit 100. In some embodiments, memory 106 may be formed as a stand-alone memory.

System bus 102 can be any type of bus for communicating any type of information such as address, data, instructions, clocks, and control. System bus 102 provides a communication backbone for communications among the processor 104, memory 106, and other peripherals 108.

Processor 104 may be any type of processor, including circuits for processing, computing, etc., such as a microprocessor (MPU), microcontroller (MCU), digital signal processor (DSP), or other type of processing core. Processing system 100 may include multiple processors like processor 104. Processor 104 is configured to execute instructions in order to carry out one or more designated tasks.

Memory 106 may include any suitable type of memory array, such as static random access memory (SRAM), for example. Memory 106 may also be coupled directly to processor 104. Integrated circuit 100 may include multiple memories like memory 106 or a combination of different memories. For example, integrated circuit 100 may include a flash memory in addition to memory 106.

Other peripherals 108 of processing system 100 may include any number of other circuits and functional hardware blocks such as accelerators, timers, counters, communications, interfaces, analog-to-digital converters, digital-to-analog converters, PLLs, and the like for example. Other peripherals 108 are each bi-directionally coupled to system bus 102 by way of respective communication buses.

Figure 2:
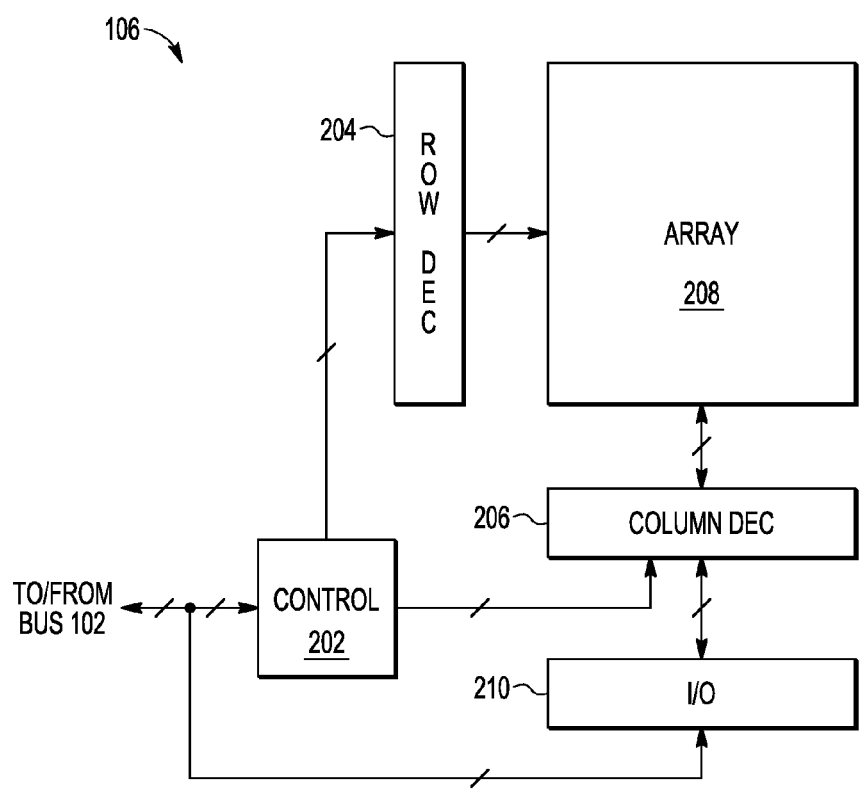
FIG. 2 illustrates, in simplified block diagram form, an exemplary memory in accordance with an embodiment of the present disclosure.

FIG. 2 illustrates, in simplified block diagram form, exemplary memory 106 in accordance with an embodiment of the present disclosure. Memory 106 includes control circuitry 202, row decoder 204, column decoder 206, memory array 208, and input/output (I/O) circuitry 210. The control circuitry 202 and I/O circuitry 210 of memory 106 are coupled to system bus 102 by way of a communication bus. The communication bus generally includes address, data, clocks, and control signals for communicating with processor 104 for example. The control circuitry 202 is coupled to provide address and read/write (R/W) information to row decoder 204 and column decoder 206.

Memory array 208 includes a plurality of memory cells arranged in rows and columns. In this embodiment, memory array 208 includes a plurality of SRAM cells. Row decoder 204 is coupled to memory array 208 and based on provided address information, activates a desired word line to read or write one or more memory cells of the memory array 208. Column decoder 206 includes write driver circuitry and column multiplexers. Column decoder 206 is coupled between memory array 208 and I/O circuitry 210 and based on provided address information, selects desired columns or bit lines to read or write the one or more memory cells of the memory array 208. As used herein, the terms bit line and column may be used interchangeably, and the terms word line and row may be used interchangeably.

The I/O circuitry 210 is coupled to system bus 102 to receive data to be written to memory array 208, and to transmit data read or sensed from memory array 208. I/O circuitry 210 includes sense amplifiers coupled to column decoder 206 and includes circuitry to sense voltage on each selected bit line such that the sensed voltage level determines the value of data stored in memory cells. Data sensed in the sense amplifiers may be latched in the I/O circuitry 210.

Figure 3:
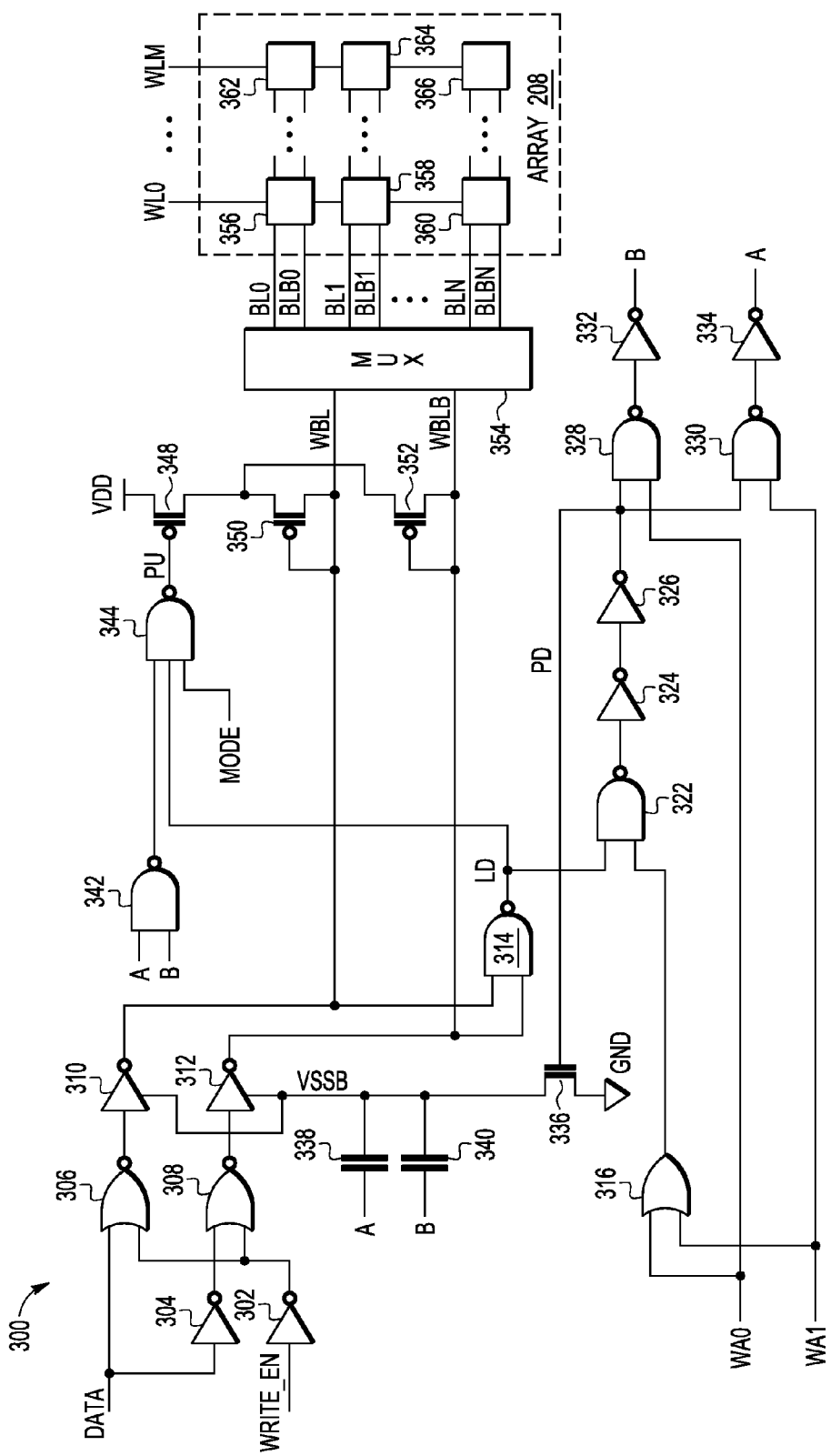
FIG. 3 illustrates, in simplified schematic diagram form, an exemplary write driver circuit in accordance with an embodiment of the present disclosure.

FIG. 3 illustrates, in simplified schematic diagram form, an exemplary write driver circuit 300 in accordance with an embodiment of the present disclosure. A plurality of write driver circuits like write driver circuit 300 may be included in column decoder 206. Write driver circuit 300 includes inputs to receive data (DATA), write enable (WRITE_EN), mode (MODE), and write assist enable (WA0, WA1) signals. Write driver 300 also includes an output for providing complementary output signals (WBL, WBLB). The output of write driver 300 is coupled to memory array 208 by way of column multiplexer 354. Based on provided address information, column multiplexer 354 selects a desired column to couple to the output of write driver 300. Column multiplexer 354 may be configured to select a column in a variety of column arrangements. Column multiplexer 354 may select 1 of N columns, where N is the number of columns (e.g., 2, 4, 8, 16, and so on) per write driver depending on the topology of memory array 208.

Write driver circuit 300 includes driver circuitry, self-timed assist circuitry, and recycling circuitry. The driver circuitry includes inverters 302 and 304, NOR gates 306 and 308, and drivers 310 and 312. The self-timed assist circuitry includes NAND gates 314 and 322, delay inverters 324 and 326, NAND gates 328 and 330, inverters 332 and 334, transistor 336, and capacitors 338 and 340. The self-timed circuitry also includes enable circuitry including OR gate 316 and corresponding write assist enable signals WA0 and WA1. The recycling circuitry includes NAND gates 342 and 344 and transistors 348, 350, and 352.

Data signal labeled DATA is received at a first input of NOR gate 306 and at an input of inverter 304. An output of inverter 304 is coupled to a first input of NOR gate 308. Write enable signal labeled WRITE_EN is received at an input of inverter 302, and an output of inverter 302 is coupled to a second input of NOR gates 306 and 308. Outputs of NOR gates 306 and 308 are coupled to an input of drivers 310 and 312 respectively. An output of drivers 310 and 312 each drive respective complementary write bit lines labeled WBL and WBLB. Drivers 310 and 312 include a VSS terminal coupled to receive a voltage signal labeled VSSB at node VSSB. In this embodiment, drivers 310 and 312 are characterized as inverter drivers having each include a P-channel transistor and an N-channel transistor coupled in series, having gate electrodes coupled to the input and first current electrodes coupled to the output. A second current electrode of the P-channel transistor is coupled to a VDD voltage supple terminal, and a second current electrode of the N-channel transistor is coupled to the VSS terminal. A nominal operating voltage, typically referred to as VDD, may be provided at the VDD voltage supply terminal.

The self-timed assist circuitry of write driver circuit 300 is coupled to the driver circuitry. Outputs of drivers 310 and 312 are coupled to inputs of NAND gate 314, and an output of NAND gate 314 is coupled to a first input of NAND gate 322 at node labeled LD. Write assist enable signals labeled WA0 and WA1 are received at first and second inputs of OR gate 316. Write assist enable signals WA0-1 allow for the self-timed assist circuitry to be enabled, configured, and tuned. An output of OR gate 316 is coupled to a second input of NAND gate 322 and serves as an enable signal to the self-timed assist circuitry. An output of NAND gate 322 is coupled to an input of inverter 324, and an output of inverter 324 is coupled to an input of inverter 326. An output of inverter 326 is coupled to first inputs of NAND gates 328 and 330 and to a gate electrode of N-channel transistor 336 at node labeled PD. A first current electrode of N-channel transistor 336 is coupled to a ground voltage supply terminal labeled GND. Second inputs of NAND gates 328 and 330 are coupled to receive write assist enable signals WA0 and WA1 respectively. Outputs of NAND gates 328 and 330 are coupled to inputs of inverters 332 and 334 respectively. An output of inverter 332 is coupled to a first terminal of capacitor 340 at node labeled B, and an output of inverter 334 is coupled to a first terminal of capacitor 338 at node labeled A. A second terminal of capacitors 338 and 340 are coupled to a second current electrode of N-channel transistor 336 and VSS terminals of drivers 310 and 312 at node VSSB. Because capacitors 338 and 340 are coupled at VSS terminals of drivers 310 and 312, the capacitance of capacitors 338 and 340 is isolated from write bit lines WBL and WBLB when the self-timed assist circuitry is disabled.

Capacitors 338 and 340 can be formed with any suitable materials and structures available in a given process technology such as metal-oxide-semiconductor (MOS) capacitors, metal-insulator-metal (MIM) capacitors, polysilicon-insulator-polysilicon (PIP) capacitors, deep trench capacitors, and the like, for example. Capacitors 338 and 340 may be formed as a combination of the above capacitor types. For example, each of capacitor 338 and 340 may be formed as a MOS capacitor in parallel or in series with a MIM capacitor. Capacitors 338 and 340 may be formed as different capacitor types. For example, capacitor 338 may be formed as a MOS capacitor and capacitor 340 may be formed as a MIM capacitor. Capacitors 338 and 340 may also be referred to as capacitive elements.

The recycling circuitry of write driver circuit 300 is coupled to the driver circuitry and the self-timed assist circuitry. Outputs of inverter drivers 332 and 334 are also coupled to inputs of NAND gate 342 at nodes A and B respectively, and an output of NAND gate 342 is coupled to a first input of NAND gate 344. The output of NAND gate 314 is also coupled to a second input of NAND gate 344 at node LD, and a third input of NAND gate 344 is coupled to receive a mode signal labeled MODE. An output of NAND gate 344 is coupled to a control electrode of P-channel transistor 348 at node labeled PU. When the MODE signal is in a first state, assert as a logic high value for example, the recycling circuitry is enabled. The MODE signal may correspond to any suitable mode such as a test mode, for example, when it is desired to repeatedly pulse a write bit line below ground. Such test mode may include stress testing memory cells during a write operation with repeated below ground pulses, for example. A first current electrode of P-channel transistor 348 is coupled to a voltage supply terminal labeled VDD, and a second current electrode of P-channel transistor 348 is coupled to a first current electrode of P-channel transistors 350 and 352. A control electrode and a second current electrode of P-channel transistor 350 are coupled to write bit line WBL, and a control electrode and a second current electrode of P-channel transistor 352 are coupled to complement write bit line WBLB.

The complementary write bit lines WBL and WBLB of write driver 300 are coupled to column multiplexer 354. Column multiplexer 354 is coupled to a plurality of complementary bit line pairs (e.g., BL0/BLB0, BL1/BLB1, through BLN/BLBN) in memory array 208, and selects a desired bit line pair to couple to the complementary write bit lines WBL and WBLB during a write operation. Memory array 208 includes a plurality of memory cells (e.g., bit cells 356-366) organized in M+1 rows and N+1 columns, where M and N can be any integer. A column of memory cells includes a bit line pair and all of the memory cells connected to the bit line pair. For example, bit line pair BL0/BLB0 along with memory cells 356 and 362 coupled to bit line pair BL0/

BLB0, form a column. Bit line pairs BL1/BLB1 through BLN/BLBN along with their respective memory cells, each form a column. Likewise, a row of memory cells includes a word line (e.g., WL0 through WLM) and all of the memory cells connected to the word line. For example, word line WL0 and the memory cells 356-360 coupled thereto forms a row. Also, word lines through WLM and the memory cells coupled thereto each forms a row. In this embodiment, memory cell 356 is at the intersection of a column having bit line pair BL0/BLB0 and a row having word line WL0.

Figure 4:
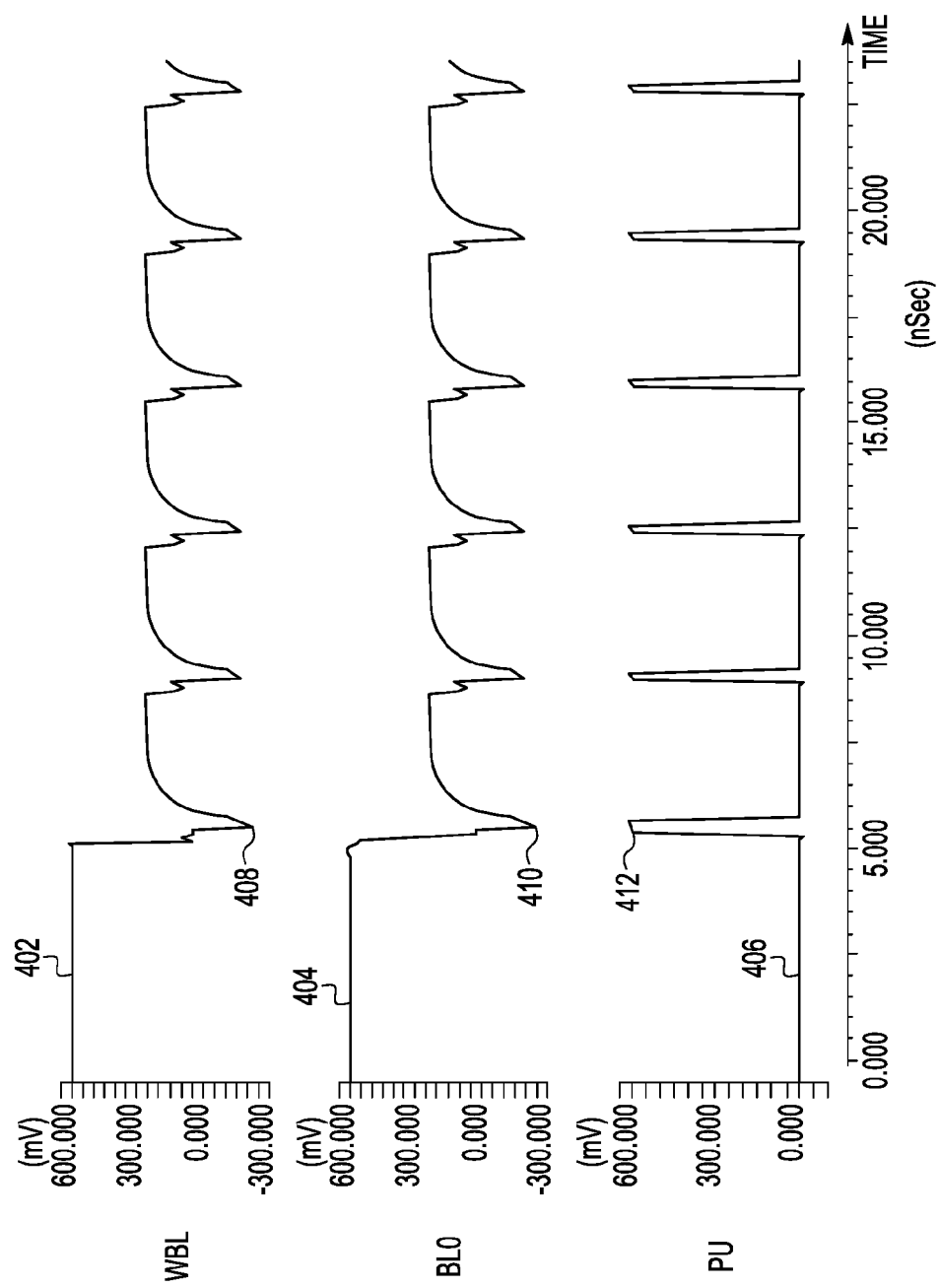
FIG. 4 illustrates, in a waveform view, various signals of the write driver circuit in accordance with an embodiment of the present disclosure.

FIG. 4 illustrates, in a waveform view, various signals of the exemplary write driver circuit 300 in accordance with an embodiment of the present disclosure. The various signals waveforms include an exemplary write bit line signal WBL (402), corresponding bit line signal BL0 (404) coupled to WBL, and pull-up signal PU (406). Voltage waveform signals are provided at the Y-axes and timing of the signals is provided at the X-axis. By way of example, operation of the exemplary write driver circuit 300 follows.

Waveform signals shown in FIG. 4 may correspond to memory operation characterized as low voltage memory operation. Low voltage memory operation according to embodiments of the present disclosure, may generally include operating voltages in a range from 1.0 volt down to a few hundred millivolts, depending upon given process technology.

Write enable signal WRITE_EN is de-asserted as a logic low level to disable write driver circuit 300. When disabled, both WBL and WBLB are driven high. In some embodiments, when write driver circuit 300 is disabled, both WBL and WBLB may be driven low. Write enable signal WRITE_EN is asserted as a logic high level to enable write driver circuit 300 during a write operation, for example.

When write driver circuit 300 is enabled, data signal DATA and its complement are propagated to write bit lines WBL and WBLB by way of drivers 310 and 312 respectively. In the exemplary WBL waveform 402 illustrated in FIG. 4, the WBL signal begins to transition to a logic low voltage level at approximately 5 nanoseconds on the TIME axis. When the WBL signal begins to transition to a logic low, a self-timed path beginning with NAND gate 314 is activated depending upon at least one of the write assist enable signals WA0-1 being asserted. In turn, the output of inverter 326 transitions to a logic low at node PD causing pull-down transistor 336 to turn off. When pull-down transistor 336 is turned off, the VSSB node is isolated from ground voltage supply terminal labeled GND.

After the output of inverter 326 transitions to a logic low level, the output of one or both of inverters 332 and 334 transitions to a logic low level causing corresponding capacitors(s) to boost the VSS terminal of drivers 310 and 312 at node VSSB to a voltage below ground. In this embodiment, the boosted voltage at node VSSB may be approximately 300 millivolts below ground. The WLB waveform shows resulting boosted voltage pulse 408 at the output of driver 310 coupled to write bit line WBL. In this example, BL0 is coupled by way of column multiplexer 354 to WBL, and therefore bit line signal waveform 404 follows WBL with similar boosted voltage pulse 410.

Mode signal labeled MODE illustrated in FIG. 3 enables and disables recycling circuitry. The recycling circuitry allows for a boosted write bit line (WBL, WBLB) to be pulled up to voltage level above ground. In this embodiment, the recycling circuitry may pull up a boosted write bit line to a level approximately 200 millivolts above ground. Responsive to WBL transitioning to a logic low, recycling circuitry when enabled momentarily turns off pull-up transistor 348 by pulsing node PU to a logic high level. The PU logic high pulse 412 isolates pull-up diodes 350 and 352 from VDD voltage supply terminal while write bit line WBL is boosted below ground for example. After PU logic high pulse 412, pull-up transistor 348 is turned on causing WBL to be pulled up to a voltage level above ground. After WBL is pulled up, the output of NAND gate 314 will transition to a logic low at node LD. In turn, the output of inverter 326 transitions to a logic high at node PD turning on pull-down transistor 336 and causing the output of driver 310 to transition to a logic low again (without changing states of the DATA input signal).

When the output of driver 310 transitions to a logic low again, the self-timed path beginning with NAND gate 314 is activated again. In turn, the output of inverter 326 transitions to a logic low at node PD causing pull-down transistor 336 to turn off, isolating the VSSB node from ground voltage supply terminal labeled GND. After the output of inverter 326 transitions to a logic low level, the corresponding capacitors(s) boost the VSS terminal of drivers 310 and 312 at node VSSB to a voltage below ground. The recycling waveforms for WBL, BL0, and PU are shown continuing at approximately 8 nanoseconds on the TIME axis and beyond. Repeating the boosted voltage pulses as illustrated in the BL0 waveform may be desired to stress test memory cells coupled to BL0 during a write operation, for example.

Generally, there is provided, a circuit including a first driver to provide a first driver signal at an output, the first driver signal corresponding to a voltage operatively coupled to a VSS terminal when driving a logic low; a first capacitor having a first terminal coupled to the VSS terminal of the first driver, and a second terminal; and a boost circuit having a first input coupled to the output of the first driver and a first output coupled to the second terminal of the first capacitor, the boost circuit configured to cause the first capacitor to provide a boosted voltage at the VSS terminal. The boost circuit may be activated in response to a falling edge of the first driver signal, the boost circuit when activated provides a first boost signal at the first output causing the first capacitor to provide the boosted voltage at the VSS terminal. The circuit may further include a multiplexing circuit having an input coupled to the output of the first driver, and an output selectively coupled to one of a plurality of memory bit lines. The circuit may further include a first transistor having a first current electrode coupled to a first voltage supply terminal, a second current electrode coupled to the VSS terminal of the first driver, and a control electrode coupled to receive a second boost signal at a second output of the boost circuit, the first transistor providing a first voltage at the VSS terminal when the second boost signal is in a first state. The boosted voltage may be provided when the second boost signal is in a second state, the boosted voltage lower than the first voltage. The circuit may further include a first diode coupled to the output of the first driver. The first diode coupled to the output of the first driver may be formed by coupling a gate electrode and a first current electrode of a second transistor to the output of the first driver. The circuit may further include a third transistor having a first current electrode coupled to a second current electrode of the second transistor and a second current electrode coupled to a second voltage supply terminal. The circuit may further include recycling control circuitry having a input coupled to the first output of the boost circuit and an output coupled to a control electrode of the third transistor, the recycling control circuitry enabling the first driver signal to be pulled up to a voltage higher than the first voltage.

In another embodiment, there is provided, a memory including a first driver having an output coupled to a first write bit line, the first driver configured to couple a voltage at a VSS terminal of the first driver to the first write bit line when driving a logic low; a first capacitor having a first terminal coupled to the VSS terminal of the first driver, and a second terminal; a first transistor having a first current electrode coupled to a first voltage supply terminal, a second current electrode coupled to the VSS terminal of the first driver, and a control electrode coupled to receive a first control signal, the first transistor providing a first voltage at the VSS terminal when the first control signal is in a first state; and a boost circuit having an input coupled to the output of the first driver, the boost circuit coupled to provide a first boost signal at the second terminal of the first capacitor and coupled to provide the first control signal at the control electrode of the first transistor, the first boost signal to cause the first capacitor to provide a boosted voltage at the VSS terminal of the first driver, the boosted voltage lower than the first voltage. The boost circuit may be activated in response to a falling edge detected at the output of the first driver, when the boost circuit is activated, the first control signal transitions to a second state and the first boost signal causes the first capacitor to provide the boosted voltage at the VSS terminal. The memory may further include a second driver having an output coupled to a second write bit line complementary of the first write bit line, the second driver driving a logic high when the first driver is driving a logic low. The memory may further include a multiplexing circuit having inputs coupled to the first write bit line and the second write bit line, and an output selectively coupled to one of a plurality of complementary pairs of bit lines. The memory may further include a first diode coupled the first write bit line and a second diode coupled to the second write bit line. The memory may further include a second transistor having a first current electrode coupled to a second voltage supply terminal and a second current electrode coupled to the first diode and the second diode. The memory may further include recycling control circuitry having an input coupled to receive the first boost signal and an output coupled to a control electrode of the second transistor, the recycling control circuitry enabling the first write bit line and second write bit line to be pulled up to a voltage higher than the first voltage. The memory may further include a second capacitor having a first terminal coupled to the VSS terminal of the first driver, and a second terminal coupled to receive a second boost signal from the boost circuit.

In yet another embodiment, there is provided, a method including generating a first driver signal at an output of a first driver, the first driver signal corresponding to a voltage operatively coupled to a VSS terminal of the first driver when driving a logic low; coupling a first terminal of a capacitor to the VSS terminal of the first driver; receiving the first driver signal at an input of a boost circuit, and responsive to the first driver signal, the boost circuit providing a boost signal to a second terminal of the capacitor to generate a boosted voltage below ground at the VSS terminal of the first driver; and operatively coupling a ground voltage to the VSS terminal of the first driver when the boost circuit is not generating a boosted voltage. The method may further include coupling by way of a multiplexing circuit the output of a first driver to one of a plurality of memory bit lines. The method may further include receiving the boost signal at an input of a recycling circuit coupled to the output of the first driver, the recycling circuit enabling the first driver signal to be pulled up to a voltage higher than ground.

By now it should be appreciated that there has been provided, a write driver circuit and method for operating low voltage memories. The write driver circuit includes write assist features which enable reliable low voltage writes to memory cells. The write assist features include boost circuitry to boost a corresponding write bit line below ground during a write operation. The write driver circuit also includes recycling features. A recycle circuit coupled to the write bit line allows for a boosted write bit line to be pulled up above ground, retriggering the boost circuitry to boost the corresponding write bit line below ground again without changing data input to the write driver. The recycling features allow for repetitive write stress of memory cells and can be useful in test scenarios, for example.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Each signal described herein may be designed as positive or negative logic, where negative logic can be indicated by a bar over the signal name, an asterix (*) following the name, or the letter "B" at the end of the signal name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit, comprising:
a first driver to provide a first driver signal at an output of the first driver, the first driver signal corresponding to a voltage operatively coupled at a VSS terminal of the first driver when driving a logic low;
a first capacitor having a first terminal coupled to the VSS terminal of the first driver, and a second terminal; and
a boost circuit having a first input coupled to the output of the first driver and a first output coupled to the second terminal of the first capacitor, the boost circuit configured to cause the first capacitor to provide a boosted voltage below ground at the VSS terminal.

2. The circuit of claim 1, wherein the boost circuit is activated in response to a falling edge of the first driver signal, the boost circuit when activated provides a first boost signal at the first output causing the first capacitor to provide the boosted voltage at the VSS terminal.

3. The circuit of claim 1, further comprising a multiplexing circuit having an input coupled to the output of the first driver, and an output selectively coupled to one of a plurality of memory bit lines.

4. The circuit of claim 1, further comprising a first transistor having a first current electrode coupled to a first voltage supply terminal, a second current electrode coupled to the VSS terminal of the first driver, and a control electrode coupled to receive a second boost signal at a second output of the boost circuit, the first transistor providing a first voltage at the VSS terminal when the second boost signal is in a first state.

5. The circuit of claim 4, wherein the boosted voltage is provided when the second boost signal is in a second state, the boosted voltage lower than the first voltage.

6. The circuit of claim 1, further comprising a first diode coupled to the output of the first driver.

7. The circuit of claim 6, wherein the first diode coupled to the output of the first driver is formed by coupling a gate electrode and a first current electrode of a second transistor to the output of the first driver.

8. The circuit of claim 7, further comprising a third transistor having a first current electrode coupled to a second current electrode of the second transistor and a second current electrode coupled to a second voltage supply terminal.

9. The circuit of claim 8, further comprising recycling control circuitry having a input coupled to the first output of the boost circuit and an output coupled to a control electrode of the third transistor, the recycling control circuitry enabling the first driver signal to be pulled up to a voltage higher than the first voltage.

10. A memory, comprising:
a first driver having an output coupled to a first write bit line, the first driver configured to couple a voltage at a VSS terminal of the first driver to the first write bit line when driving a logic low;
a first capacitor having a first terminal coupled to the VSS terminal of the first driver, and a second terminal;
a first transistor having a first current electrode coupled to a first voltage supply terminal, a second current electrode coupled to the VSS terminal of the first driver, and a control electrode coupled to receive a first control signal, the first transistor providing a first voltage at the VSS terminal when the first control signal is in a first state; and
a boost circuit having an input coupled to the output of the first driver, the boost circuit coupled to provide a first boost signal at the second terminal of the first capacitor and coupled to provide the first control signal at the control electrode of the first transistor, the first boost signal to cause the first capacitor to provide a boosted voltage at the VSS terminal of the first driver, the boosted voltage lower than the first voltage.

11. The memory of claim 10, wherein the boost circuit is activated in response to a falling edge detected at the output of the first driver, when the boost circuit is activated, the first control signal transitions to a second state and the first boost signal causes the first capacitor to provide the boosted voltage at the VSS terminal.

12. The memory of claim 10, further comprising a second driver having an output coupled to a second write bit line complementary of the first write bit line, the second driver driving a logic high when the first driver is driving a logic low.

13. The memory of claim 12, further comprising a multiplexing circuit having inputs coupled to the first write bit line and the second write bit line, and an output selectively coupled to one of a plurality of complementary pairs of bit lines.

14. The memory of claim 12, further comprising a first diode coupled the first write bit line and a second diode coupled to the second write bit line.

15. The memory of claim 14, further comprising a second transistor having a first current electrode coupled to a second voltage supply terminal and a second current electrode coupled to the first diode and the second diode.

16. The memory of claim 15, further comprising recycling control circuitry having an input coupled to receive the first boost signal and an output coupled to a control electrode of the second transistor, the recycling control circuitry enabling the first write bit line and second write bit line to be pulled up to a voltage higher than the first voltage.

17. The memory of claim 10, further comprising a second capacitor having a first terminal coupled to the VSS terminal of the first driver, and a second terminal coupled to receive a second boost signal from the boost circuit.

18. A method comprising:
generating a first driver signal at an output of a first driver, the first driver signal corresponding to a voltage operatively coupled to a VSS terminal of the first driver when driving a logic low;
coupling a first terminal of a capacitor to the VSS terminal of the first driver;
receiving the first driver signal at an input of a boost circuit, and responsive to the first driver signal, the boost circuit providing a boost signal to a second terminal of the capacitor to generate a boosted voltage below ground at the VSS terminal of the first driver; and
operatively coupling a ground voltage to the VSS terminal of the first driver when the boost circuit is not generating a boosted voltage.

19. The method of claim 18, further comprising coupling by way of a multiplexing circuit the output of a first driver to one of a plurality of memory bit lines.

20. The method of claim 18, further comprising receiving the boost signal at an input of a recycling circuit coupled to the output of the first driver, the recycling circuit enabling the first driver signal to be pulled up to a voltage higher than ground.

* * * * *